US011195920B2

(12) United States Patent
Hurwitz et al.

(10) Patent No.: US 11,195,920 B2
(45) Date of Patent: Dec. 7, 2021

(54) SEMICONDUCTOR STRUCTURE HAVING POROUS SEMICONDUCTOR SEGMENT FOR RF DEVICES AND BULK SEMICONDUCTOR REGION FOR NON-RF DEVICES

(71) Applicant: Newport Fab, LLC, Newport Beach, CA (US)

(72) Inventors: Paul D. Hurwitz, Irvine, CA (US); Edward Preisler, San Clemente, CA (US); David J. Howard, Irvine, CA (US); Marco Racanelli, Santa Ana, CA (US)

(73) Assignee: Newport Fab, LLC, Newport Beach, CA (US)

(*) Notice: Subject to any disclaimer, the term of this patent is extended or adjusted under 35 U.S.C. 154(b) by 0 days.

(21) Appl. No.: 16/598,803

(22) Filed: Oct. 10, 2019

(65) Prior Publication Data
US 2021/0111249 A1  Apr. 15, 2021

Related U.S. Application Data

(63) Continuation-in-part of application No. 16/597,779, filed on Oct. 9, 2019.

(51) Int. Cl.
*H01L 29/10* (2006.01)
*H01L 23/66* (2006.01)
(Continued)

(52) U.S. Cl.
CPC .... *H01L 29/1083* (2013.01); *H01L 21/02428* (2013.01); *H01L 21/324* (2013.01);
(Continued)

(58) Field of Classification Search
CPC ... H01L 29/1083; H01L 23/66; H01L 21/324; H01L 21/02428; H01L 27/088; H01L 29/10; H01L 21/02; H01L 21/02532; H01L 21/02667; H01L 21/76224; H01L 2223/6688
(Continued)

(56) References Cited

U.S. PATENT DOCUMENTS 6,376,285 B1  4/2002  Joyner et al.
7,420,201 B2  9/2008  Langdo et al.
(Continued)

*Primary Examiner* — Alexander O Williams
(74) *Attorney, Agent, or Firm* — Farjami & Farjami LLP

(57) ABSTRACT

A semiconductor structure includes a porous semiconductor segment adjacent to a first region of a substrate, and a crystalline epitaxial layer situated over the porous semiconductor segment and over the first region of the substrate. A first semiconductor device is situated in the crystalline epitaxial layer over the porous semiconductor segment. The first region of the substrate has a first dielectric constant, and the porous semiconductor segment has a second dielectric constant that is substantially less than the first dielectric constant such that the porous semiconductor segment reduces signal leakage from the first semiconductor device. The semiconductor structure can include a second semiconductor device situated in the crystalline epitaxial layer over the first region of the substrate, and an electrical isolation region separating the first and second semiconductor devices.

19 Claims, 8 Drawing Sheets

(51) Int. Cl.
  *H01L 21/324* (2006.01)
  *H01L 27/088* (2006.01)
  *H01L 21/02* (2006.01)

(52) U.S. Cl.
  CPC ............ *H01L 23/66* (2013.01); *H01L 27/088* (2013.01); *H01L 2223/6688* (2013.01)

(58) Field of Classification Search
  USPC .......................................................... 257/347
  See application file for complete search history.

(56) References Cited

U.S. PATENT DOCUMENTS

| | | | |
|---|---|---|---|
| 7,777,250 B2 | 8/2010 | Lochtefeld | |
| 9,385,023 B1 | 7/2016 | Cheng et al. | |
| 10,643,927 B1 | 5/2020 | Shank et al. | |
| 2002/0175378 A1* | 11/2002 | Choe | H01L 21/84 257/355 |
| 2004/0108552 A1* | 6/2004 | Azuma | H01L 27/1203 257/347 |
| 2004/0132267 A1 | 7/2004 | Sadana et al. | |
| 2007/0108513 A1 | 5/2007 | Rub et al. | |
| 2008/0034335 A1 | 2/2008 | Cheng et al. | |
| 2009/0212341 A1 | 8/2009 | Cheng et al. | |
| 2010/0203711 A1* | 8/2010 | Wang | H01L 31/035281 438/478 |
| 2013/0167915 A1* | 7/2013 | Moslehi | H01L 31/18 136/255 |
| 2013/0171767 A1* | 7/2013 | Moslehi | H01L 31/1864 438/89 |
| 2013/0249047 A1 | 9/2013 | Hung et al. | |
| 2013/0279137 A1 | 10/2013 | Gardner et al. | |
| 2013/0288418 A1* | 10/2013 | Wang | H01L 31/035281 438/68 |
| 2014/0061757 A1 | 3/2014 | Kim et al. | |
| 2014/0264630 A1 | 9/2014 | Huang et al. | |
| 2015/0021698 A1 | 1/2015 | Ando et al. | |
| 2015/0137388 A1 | 5/2015 | Kim et al. | |
| 2015/0262911 A1 | 9/2015 | Chen et al. | |
| 2016/0336428 A1 | 11/2016 | Cheng et al. | |
| 2018/0166475 A1 | 6/2018 | Chen et al. | |
| 2018/0226471 A1* | 8/2018 | Hille | H01L 29/7802 |
| 2018/0277632 A1* | 9/2018 | Fanelli | H01L 21/0203 |
| 2018/0337211 A1* | 11/2018 | Su | H01L 27/1462 |
| 2019/0002275 A1 | 1/2019 | Chang et al. | |
| 2019/0148570 A1 | 5/2019 | Wu et al. | |
| 2020/0212492 A1 | 7/2020 | Collins et al. | |
| 2020/0335826 A1 | 10/2020 | Collins et al. | |

* cited by examiner

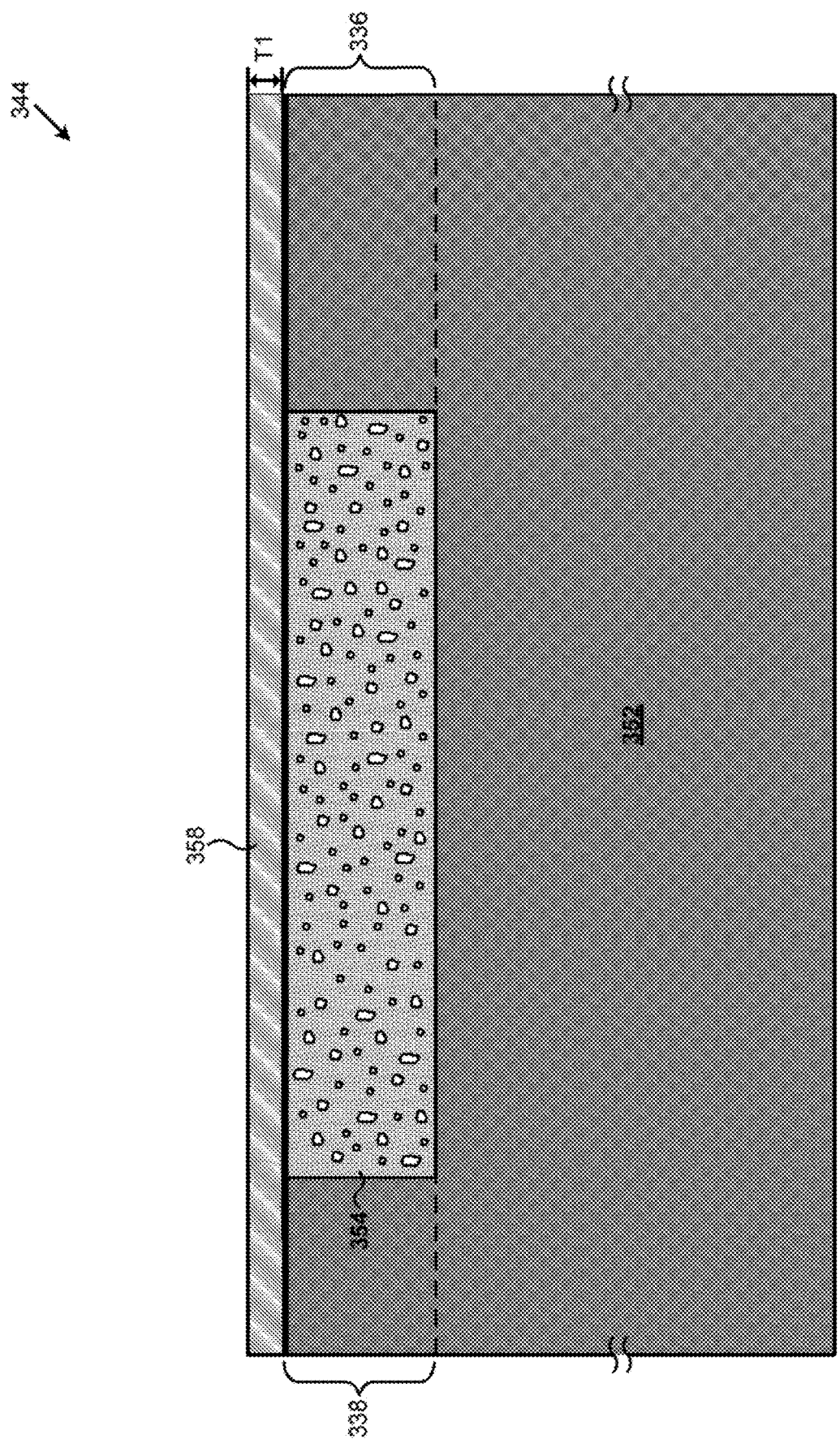

though not shown in FIG. 1, different to the implementations of the present application.

SEMICONDUCTOR STRUCTURE HAVING POROUS SEMICONDUCTOR SEGMENT FOR RF DEVICES AND BULK SEMICONDUCTOR REGION FOR NON-RF DEVICES

CLAIMS OF PRIORITY

The present application is a continuation-in-part of and claims the benefit of and priority to application Ser. No. 16/597,779 filed on Oct. 9, 2019 and titled "Semiconductor Structure Having Porous Semiconductor Layer for RF Devices,". The disclosure and content of the above-identified application are hereby incorporated fully by reference into the present application.

BACKGROUND

Semiconductor-on-insulator (SOI) structures are commonly employed to realize radio frequency (RF) designs where low signal leakage is required. These SOI structures use a buried oxide (BOX) under a top device layer in which RF circuit components, such as transistors and/or passive components, are fabricated.

As known in the art, a handle wafer functioning as a substrate under the BOX results in some signal leakage. In one approach, a high resistivity silicon is used for the handle wafer in order to improve isolation and reduce signal loss. However, the relatively high dielectric constant of silicon (k=11.7) results in significant capacitive loading of RF SOI devices. In another approach, a trap-rich layer is formed between the handle wafer and the BOX in order to minimize parasitic surface conduction effects that would adversely affect RF devices in the top device layer. However, this approach requires costly and/or specialized fabrication techniques.

Further, due to existence of the BOX in SOI structures, each CMOS device built in the top device layer is dielectrically isolated from the substrate. To control the body potential (avoid floating body effects, and hysteresis) each device requires its own body contact. This approach results in the consumption of much of the surface area in a die, decreasing logic density in the die. Further, the BOX has much low thermal conductivity compared to monocrystalline silicon (approximately one and half watts per meter-kelvin (1.5 W/(m·K)) versus approximately one hundred and fifty watts per meter-kelvin (150 W/(m·K)) respectively). As a result, high power components, such as power amplifiers, integrated in SOI structures cannot effectively dissipate heat.

Thus, there is need in the art for efficiently and effectively fabricating semiconductor dies with reduced RF signal leakage, reduced need for numerous body contacts, and increased heat dissipation at low cost.

SUMMARY

The present disclosure is directed to a semiconductor structure having at least one porous semiconductor segment for radio frequency (RF) devices and at least one bulk semiconductor region for non-RF devices, substantially as shown in and/or described in connection with at least one of the figures, and as set forth in the claims.

BRIEF DESCRIPTION OF THE DRAWINGS

FIG. 3C illustrates a cross-sectional view of a portion of a semiconductor structure processed in accordance with action 244 in the flowchart of FIG. 2 according to one implementation of the present application

DETAILED DESCRIPTION

Figure 1:
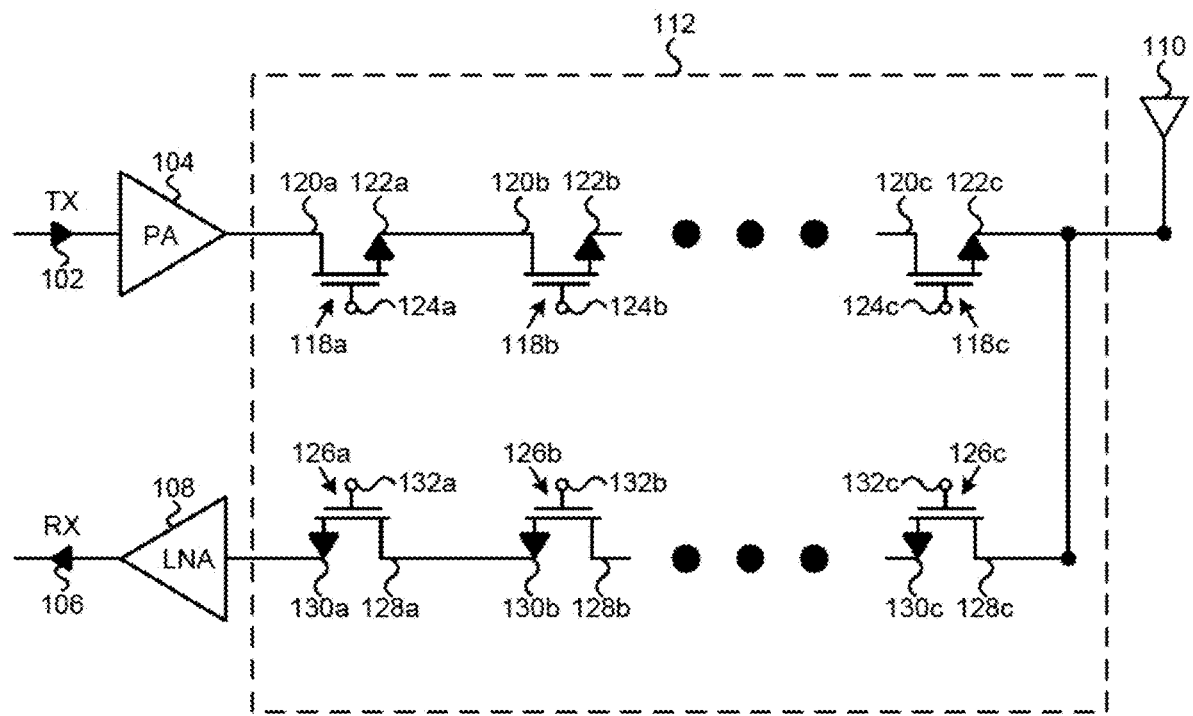
FIG. 1 illustrates a portion of a transceiver including a radio frequency (RF) switch employing stacked transistors according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a portion of a radio front-end of a transceiver (hereinafter referred to simply as a "transceiver") including a radio frequency (RF) switch employing stacked transistors according to one implementation of the present application. The transceiver in FIG. 1 includes transmit input 102, power amplifier (PA) 104, receive output 106, low-noise amplifier (LNA) 108, antenna 110, and radio frequency (RF) switch 112.

RF switch 112 is situated between PA 104 and antenna 110. PA 104 amplifies RF signals transmitted from transmit input 102. In one implementation, transmit input 102 can be coupled to a mixer (not shown in FIG. 1), or to another input source. The output of PA 104 is coupled to one end of RF switch 112. A matching network (not shown in FIG. 1) can be coupled between PA 104 and RF switch 112. Another end of RF switch 112 is coupled to antenna 110. Antenna 110 can transmit amplified RF signals. In one implementation, RF switch 112 can be coupled to an antenna array, rather than a single antenna 110.

RF switch 112 is also situated between LNA 108 and antenna 110. Antenna 110 also receives RF signals. Antenna 110 is coupled to one end of RF switch 112. Another end of RF switch 112 is coupled to the input of LNA 108. LNA 108 amplifies RF signals received from RF switch 112. A matching network (not shown in FIG. 1) can be coupled between RF switch 112 and LNA 108. Receive output 106 receives amplified RF signals from LNA 108. In one implementation, receive output 106 can be coupled to a mixer (not shown in FIG. 1), or to another output source.

RF switch 112 includes two stacks of transistors. The first stack includes transistors 118a, 118b, and 118c. Drain 120a of transistor 118a is coupled to the output of PA 104. Source 122a of transistor 118a is coupled to drain 120b of transistor 118b. Source 122b of transistor 118b can be coupled to the drain of additional transistors, and ultimately coupled to drain 120c of transistor 118c. Source 122c of transistor 118c is coupled to antenna 110. Gates 124a, 124b, and 124c of transistors 118a, 118b, and 118c respectively can be coupled to a controller or a pulse generator (not shown) for switching transistors 118a, 118b, and 118c between ON and OFF states.

The second stack includes transistors 126a, 126b, and 126c. Source 130a of transistor 126a is coupled to the input of LNA 108. Drain 128a of transistor 126a is coupled to source 130b of transistor 126b. Drain 128b of transistor 126b can be coupled to the drain of additional transistors, and ultimately coupled to drain source 130c of transistor 126c. Drain 128c of transistor 126c is coupled to antenna 110. Gates 132a, 132b, and 132c of transistors 126a, 126b, and 126c respectively can be coupled to a controller or a pulse generator (not shown) for switching transistors 126a, 126b, and 126c between ON and OFF states.

In the example of FIG. 1, RF switch 112 switches the transceiver in FIG. 1 between receive and transmit modes. When transistors 118a, 118b, and 118c are in OFF states, and transistors 126a, 126b, and 126c are in ON states, the transceiver is in receive mode. Transistors 126a, 126b, and 126c serve as a receive path for RF signals received by antenna 110 to pass to LNA 108 and to receive output 106. When transistors 118a, 118b, and 118c are in ON states, and transistors 126a, 126b, and 126c are in OFF states, the transceiver is in transmit mode. Transistors 118a, 118b, and 118c serve as a transmit path for RF signals transmitted from transmit input 102 and PA 104 to pass to antenna 110. In various implementations, RF switch 112 can include more stacks of transistors and/or more amplifiers. In various implementations, RF switch 112 can switch the transceiver between two transmit modes corresponding to different frequencies, or between two receive modes corresponding to different frequencies.

In the present implementation, transistors 118a, 118b, 118c, 126a, 126b, and 126c are N-type field effect transistors (NFETs). In various implementations, transistors 118a, 118b, 118c, 126a, 126b, and 126c can be P-type FETs (PFETs), junction FETs (JFETs), or any other type of transistor. By stacking transistors 118a, 118b, 118c, 126a, 126b, and 126c as shown in FIG. 1, the overall OFF state power and voltage handling capability for RF switch 112 can be increased. For example, if only transistors 118a and 126a were used, RF switch 112 may have an OFF-state voltage handling capability of five volts (5 V). If eight transistors were used in each stack, RF switch 112 may have an OFF-state voltage handling capability of forty volts (40 V). In various implementations. RF switch 112 can have more or fewer stacked transistors than shown in FIG. 1.

As described above, in conventional semiconductor structures, RF signals can leak from RF switch 112, for example, to ground or to other devices. This RF signal leakage is particularly problematic when transistors 118a, 118b, 118c, 126a, 126b, and 126c are in OFF states, and when dealing with higher frequency RF signals. According to the present application, RF switch 112 can be utilized in a semiconductor structure that reduces RF signal leakage. It is noted that, although the present application focuses on RF signals, the signals may have frequencies other than RF frequencies.

As also described above, conventional semiconductor structures cannot easily accommodate body contacts without tradeoffs, and cannot effectively dissipate heat from high power devices, such as PA 104, integrated with RF switch 112. According to the present application. RF switch 112 can be utilized in a semiconductor structure that integrates PA 104 (and/or LNA 108) while easily accommodating body contacts and providing effective heat dissipation therefor.

Figure 2:
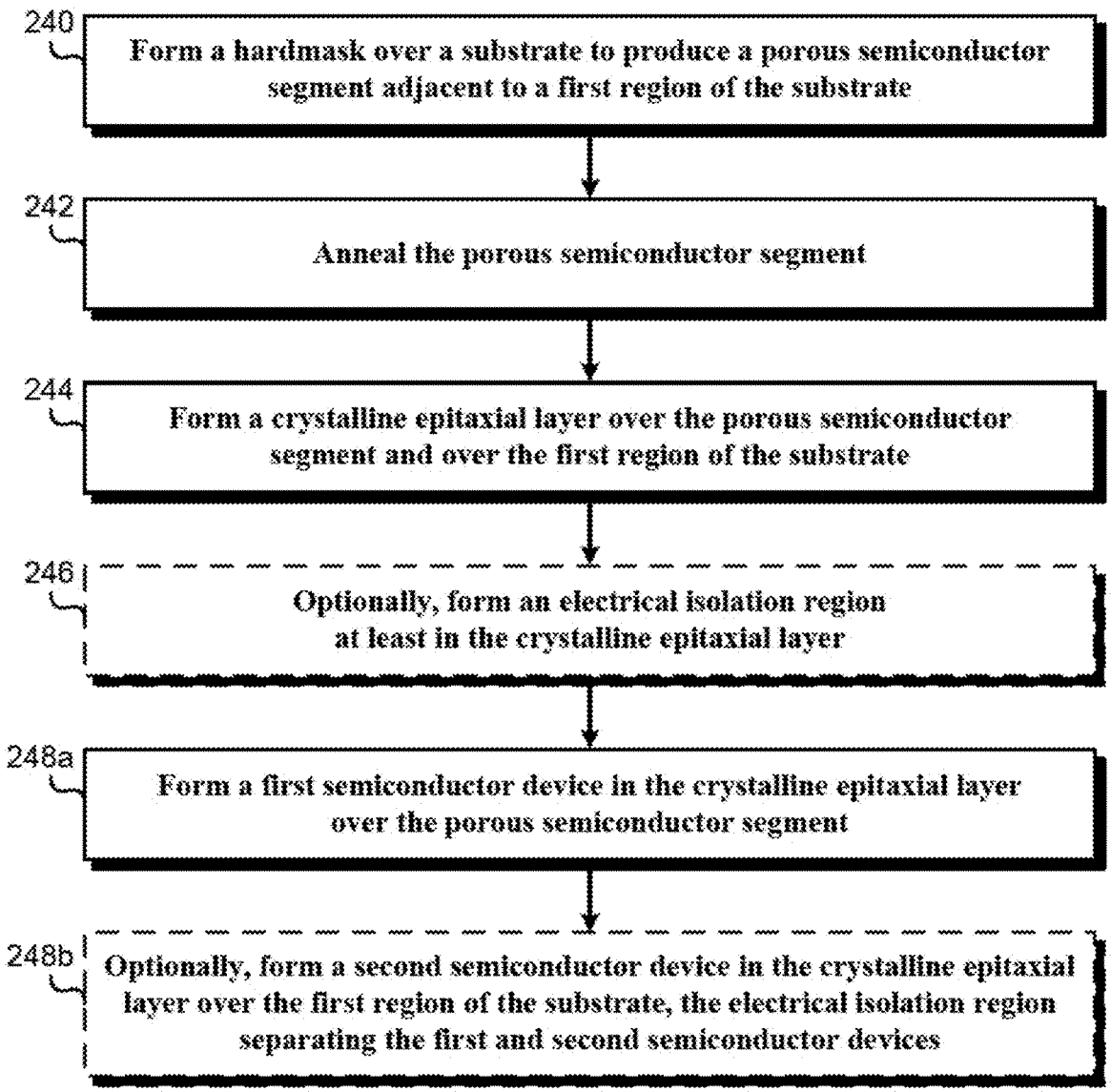
FIG. 2 illustrates a portion of a flowchart of an exemplary method for manufacturing a semiconductor structure according to one implementation of the present application.
Figure 3A:
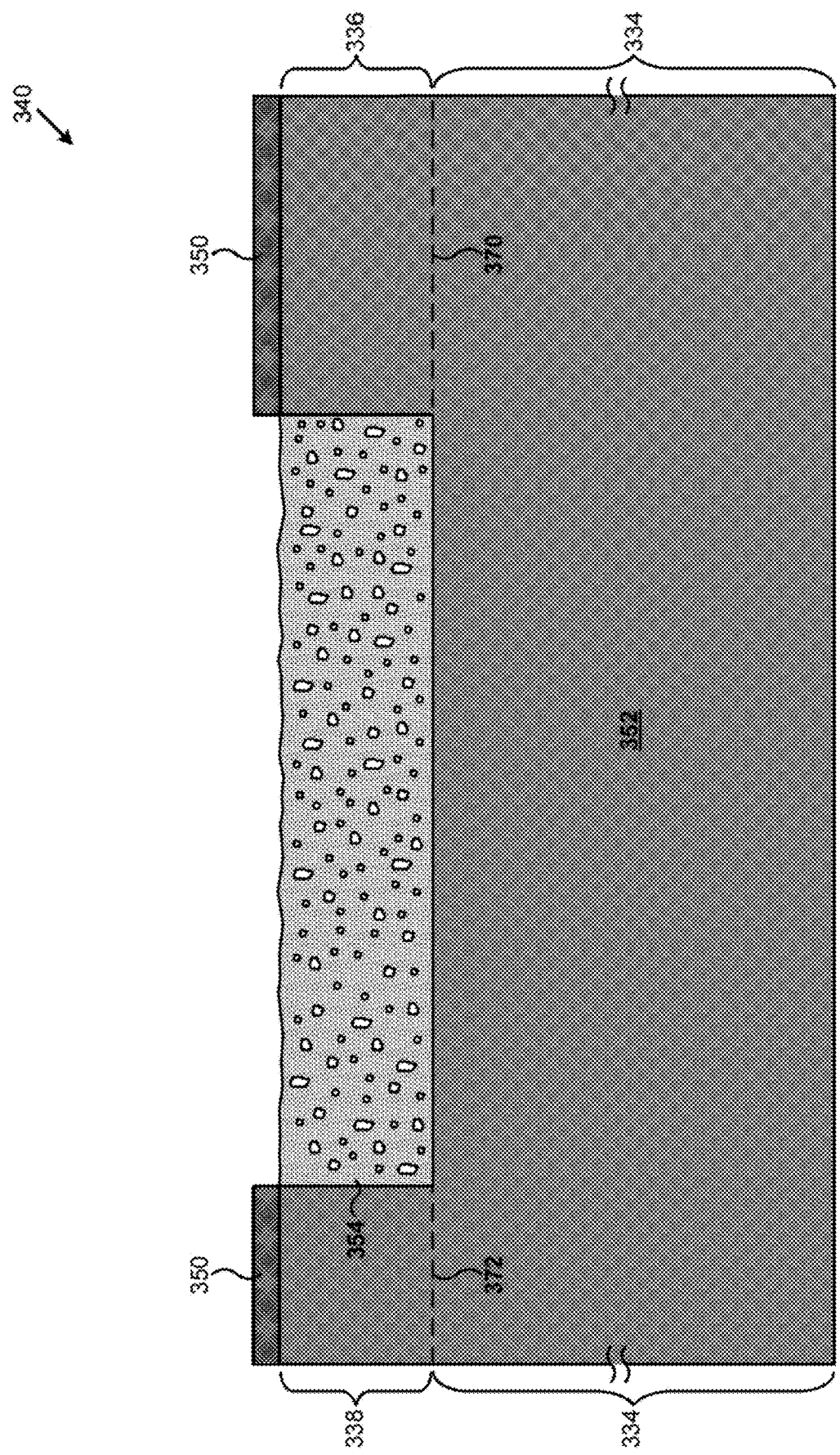
FIG. 3A illustrates a cross-sectional view of a portion of a semiconductor structure processed in accordance with action 240 in the flowchart of FIG. 2 according to one implementation of the present application.
Figure 3B:
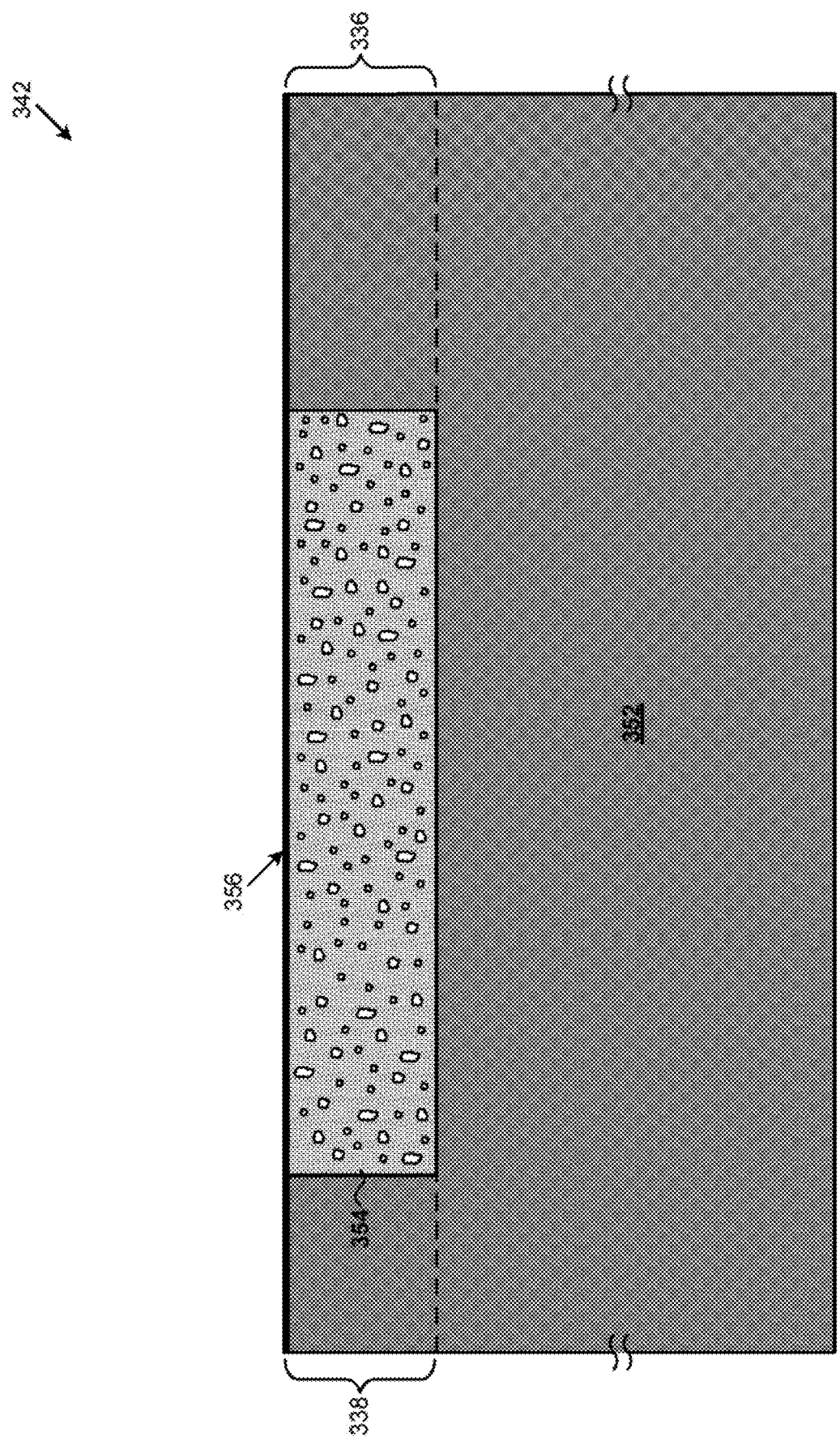
FIG. 3B illustrates a cross-sectional view of a portion of a semiconductor structure processed in accordance with action 242 in the flowchart of FIG. 2 according to one implementation of the present application

FIG. 2 illustrates a portion of a flowchart of an exemplary method for manufacturing a semiconductor structure according to one implementation of the present application. Structures shown in FIGS. 3A through 3E illustrate the results of performing actions 240 through 248b shown in the flowchart of FIG. 2. For example, FIG. 3A shows a semiconductor structure after performing action 240 in FIG. 2, FIG. 3B shows a semiconductor structure after performing action 242 in FIG. 2, and so forth.

Actions 240 through 248b shown in the flowchart of FIG. 2 are sufficient to describe one implementation of the present inventive concepts. Other implementations of the present inventive concepts may utilize actions different from those shown in the flowchart of FIG. 2. Certain details and features have been left out of the flowchart of FIG. 2 that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

FIG. 3A illustrates a cross-sectional view of a portion of a semiconductor structure processed in accordance with action 240 in the flowchart of FIG. 2 according to one implementation of the present application. As shown in FIG. 3A, according to action 240, semiconductor structure 340 includes hardmask 350 formed over bulk silicon substrate 352 to produce porous silicon segment 354 adjacent to regions 336 and 338 of bulk silicon substrate 352.

Bulk silicon substrate 352 includes regions 334, 336, and 338. Region 334 is situated under porous silicon segment 354 and under regions 336 and 338. Regions 336 and 338 are adjacent to porous silicon segment 354 on respective sides. In FIG. 3A, dashed line 370 illustrates the boundary of regions 334 and 336, and dashed line 372 illustrates the boundary of regions 334 and 338. It is understood that dashed lines 370 and 372 merely illustrate conceptual boundaries of regions 334, 336, and 338, and that regions 334, 336, and 338 of bulk silicon substrate 352 is typically one continuous bulk semiconductor material. In the present implementation, bulk silicon substrate 352 is a P– or P+ type bulk silicon substrate having a thickness of approximately seven hundred microns (700 µm). In various implementations, bulk silicon substrate 352 may be any other type of substrate.

Porous silicon segment 354 adjacent to regions 336 and 338 and situated over region 334 is a silicon segment having voids, or pores, therein. Within porous silicon segment 354, the pores can have any orientation, branching, fill, or other morphological characteristic known in the art. Porous silicon segment 354 can be formed by using a top-down technique, where portions of bulk silicon substrate 352 are removed to generate pores. In the present implementation, hardmask 350 is formed over bulk silicon substrate 352 to expose a segment thereof. Then, porous silicon segment 354 is formed by electrochemical etching the exposed segment of bulk silicon substrate 352 using hydrofluoric acid (HF).

Hardmask 350 can comprise, for example, silicon nitride (SiN). Alternatively, porous silicon segment 354 can also be formed by stain etching, photoetching, or any other top-down technique known in the art.

Porous silicon segment 354 can also be formed by using a bottom-up technique, where deposition results in a silicon segment having voids. For example, a trench can be etched in bulk silicon substrate 352. Then, a porous silicon layer can be formed by low-temperature high-density plasma (HDP) deposition. Then, porous silicon segment 354 can be formed by removing portions of the porous silicon layer outside the trench, for example, using chemical machine polishing (CMP). Alternatively, the porous silicon layer can also be formed by plasma hydrogenation of an amorphous layer, laser ablation, or any other bottom-up technique known in the art. In the present implementation, porous silicon segment 354 has a thickness from approximately ten microns (10 μm) to approximately fifty microns (50 μm). In various implementations, porous silicon segment 354 can have any other thickness. In various implementations, porous segment 354 may be a semiconductor material other than silicon.

FIG. 3B illustrates a cross-sectional view of a portion of a semiconductor structure processed in accordance with action 242 in the flowchart of FIG. 2 according to one implementation of the present application. In semiconductor structure 342, porous silicon segment 354 is annealed. For example, porous silicon segment 354 can be annealed in argon (Ar) or hydrogen ($H_2$) at atmospheric pressure from a temperature of approximately seven hundred degrees Celsius (700° C.) to a temperature of approximately eleven hundred degrees Celsius (1100° C.) for approximately ten minutes (10 min). Any other annealing technique known in the art can be utilized, such as techniques utilizing different temperatures, durations, and/or pressures. The annealing shown in FIG. 3B reorganizes the pores in porous silicon segment 354 into larger cavities, while closing and smoothing surface 356. The annealed porous silicon segment 354, along with regions 336 and 338 of bulk silicon substrate 352, serves as a template layer for growth of a crystalline epitaxial layer in a subsequent action.

FIG. 3C illustrates a cross-sectional view of a portion of a semiconductor structure processed in accordance with action 244 in the flowchart of FIG. 2 according to one implementation of the present application. In semiconductor structure 344, crystalline epitaxial layer 358 is formed over porous silicon segment 354 and over regions 336 and 338 of bulk silicon substrate 352. Crystalline epitaxial layer 358 is a thin layer of single-crystal material. In one implementation, crystalline epitaxial layer 358 is formed by chemical vapor deposition (CVD). In various implementations, crystalline epitaxial layer 358 can be formed by any other epitaxy technique known in the art. In the present implementation, crystalline epitaxial layer 358 is a silicon epitaxial layer, and has thickness T1 from approximately five hundred angstroms (500 Å) to approximately two thousand angstroms (2000 Å). In various implementations, crystalline epitaxial layer 358 may be any other type of crystalline epitaxial layer. In various implementations, more than one crystalline epitaxial layer 358 can be formed. Crystalline epitaxial layer 358 serves as device region for formation of semiconductor devices in subsequent actions.

Figure 3D:
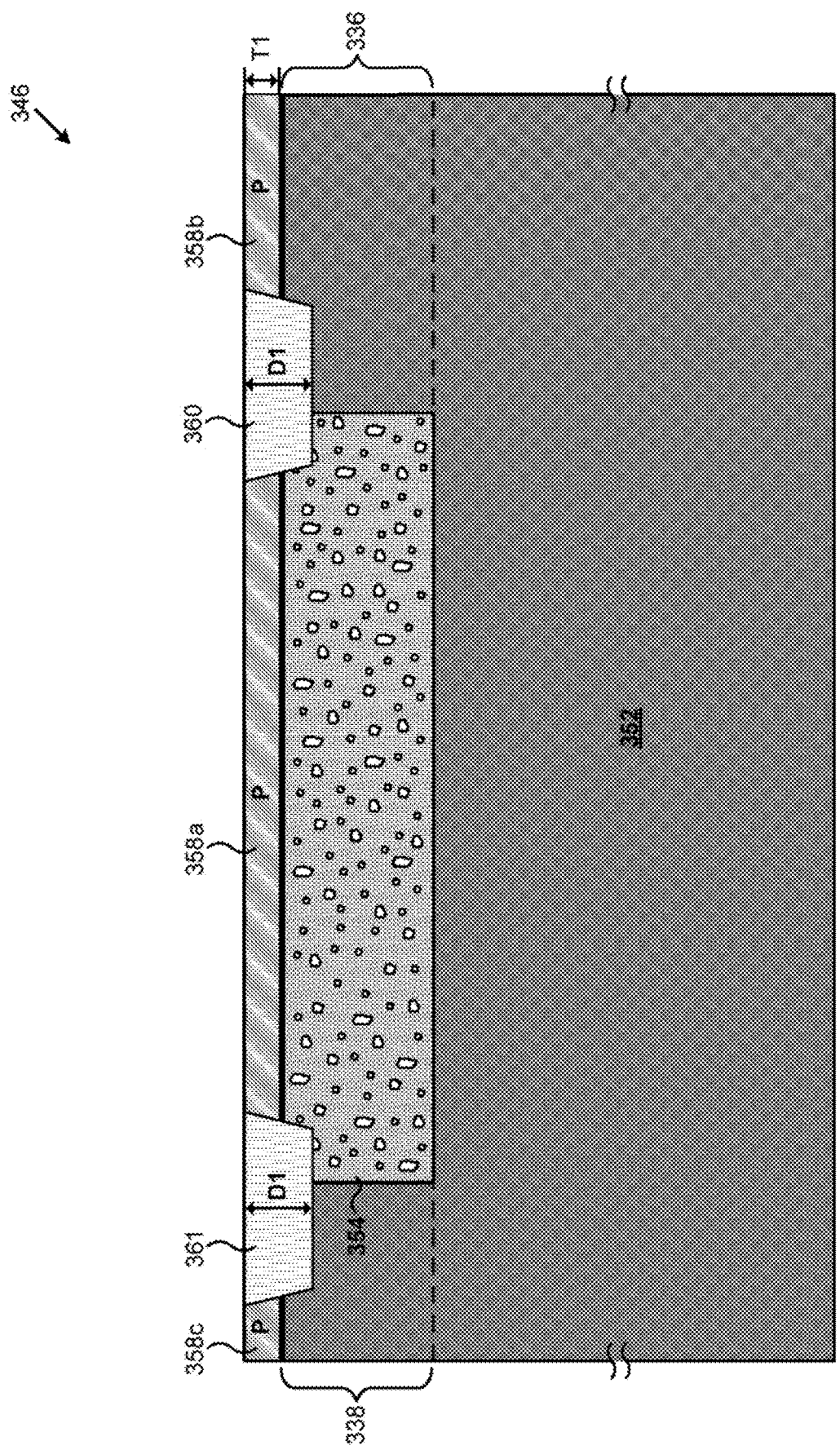
FIG. 3D illustrates a cross-sectional view of a portion of a semiconductor structure processed in accordance with action 246 in the flowchart of FIG. 2 according to one implementation of the present application.

FIG. 3D illustrates a cross-sectional view of a portion of a semiconductor structure processed in accordance with optional action 246 in the flowchart of FIG. 2 according to one implementation of the present application. In semiconductor structure 346 of FIG. 3D, electrical isolation regions 360 and 361 are formed at least in crystalline epitaxial layer 358 (shown in FIG. 3C). In particular, in the example of FIG. 3D, electrical isolation region 360 extends through crystalline epitaxial layer 358, into porous silicon segment 354 and region 336 of bulk silicon substrate 352. Similarly, electrical isolation region 361 extends through crystalline epitaxial layer 358, into porous silicon segment 354 and region 338 of bulk silicon substrate 352.

Electrical isolation region 360 can be formed by etching through crystalline epitaxial layer 358, into porous silicon segment 354 and region 336 of bulk silicon substrate 352, then depositing an electrically insulating material. Similarly, electrical isolation region 361 can be formed by etching through crystalline epitaxial layer 358, into porous silicon segment 354 and region 338 of bulk silicon substrate 352, then depositing an electrically insulating material. In the present implementation, electrical isolation regions 360 and 361 are also planarized with the top surface of crystalline epitaxial layer 358, for example, by using CMP. Electrical isolation regions 360 and 361 can comprise, for example, silicon dioxide ($SiO_2$). In the present implementation, depth D1 of electrical isolation regions 360 and 361 is greater than thickness T1 of crystalline epitaxial layer 358. Accordingly, electrical isolation regions 360 and 361 separate crystalline epitaxial layer 358 of FIG. 3C into three crystalline epitaxial layers 358a, 358b, and 358c.

In one implementation, depth D1 of electrical isolation regions 360 and 361 can be substantially equal to thickness T1. In another implementation, depth D1 of electrical isolation regions 360 and 361 can be less than thickness T1, such that electrical isolation regions 360 and 361 extend into crystalline epitaxial layer 358, but not into porous silicon segment 354 or regions 336 and 338 of bulk silicon substrate 352. In various implementations, locally oxidized silicon (LOCOS) can be used instead of or in addition to electrical isolation regions 360 and 361. In various implementations, electrical isolation regions 360 and 361 can extend into porous silicon segment 354, but not into regions 336 and 338 of bulk silicon substrate 352, or vice versa. In various implementations, semiconductor structure 346 includes additional electrical isolation regions.

Crystalline epitaxial layers 358a, 358b, and 358c can also be implanted with a dopant. In the present implementation, crystalline epitaxial layers 358a, 358b, and 358c are implanted with boron or other appropriate P-type dopant. In another implementation, one, two, or all of crystalline epitaxial layers 358a, 358b, and 358c can be implanted with phosphorus or other appropriate N-type dopant. One or more masks can be utilized to define portions of crystalline epitaxial layers 358a, 358b, and 358c that will be implanted with dopants. In one implementation, crystalline epitaxial layers 358a, 358b, and 358c are implanted with a dopant after forming electrical isolation regions 360 and 361. In another implementation, crystalline epitaxial layer 358 in FIG. 3C can be implanted with dopants before forming electrical isolation regions 360 and 361. In this implementation, electrical isolation regions 360 and 361 can be formed in a uniform implant region, between two implant regions having different types or concentrations, and/or where two implant regions overlap.

As described below, electrical isolation regions 360 and 361 reduce RF signal interference across crystalline epitaxial layers 358a, 358b, and 358c. Electrical isolation regions 360 and 361 are considered optional in that semiconductor structures according to the present application can be formed without electrical isolation regions 360 and 361.

Figure 3E:
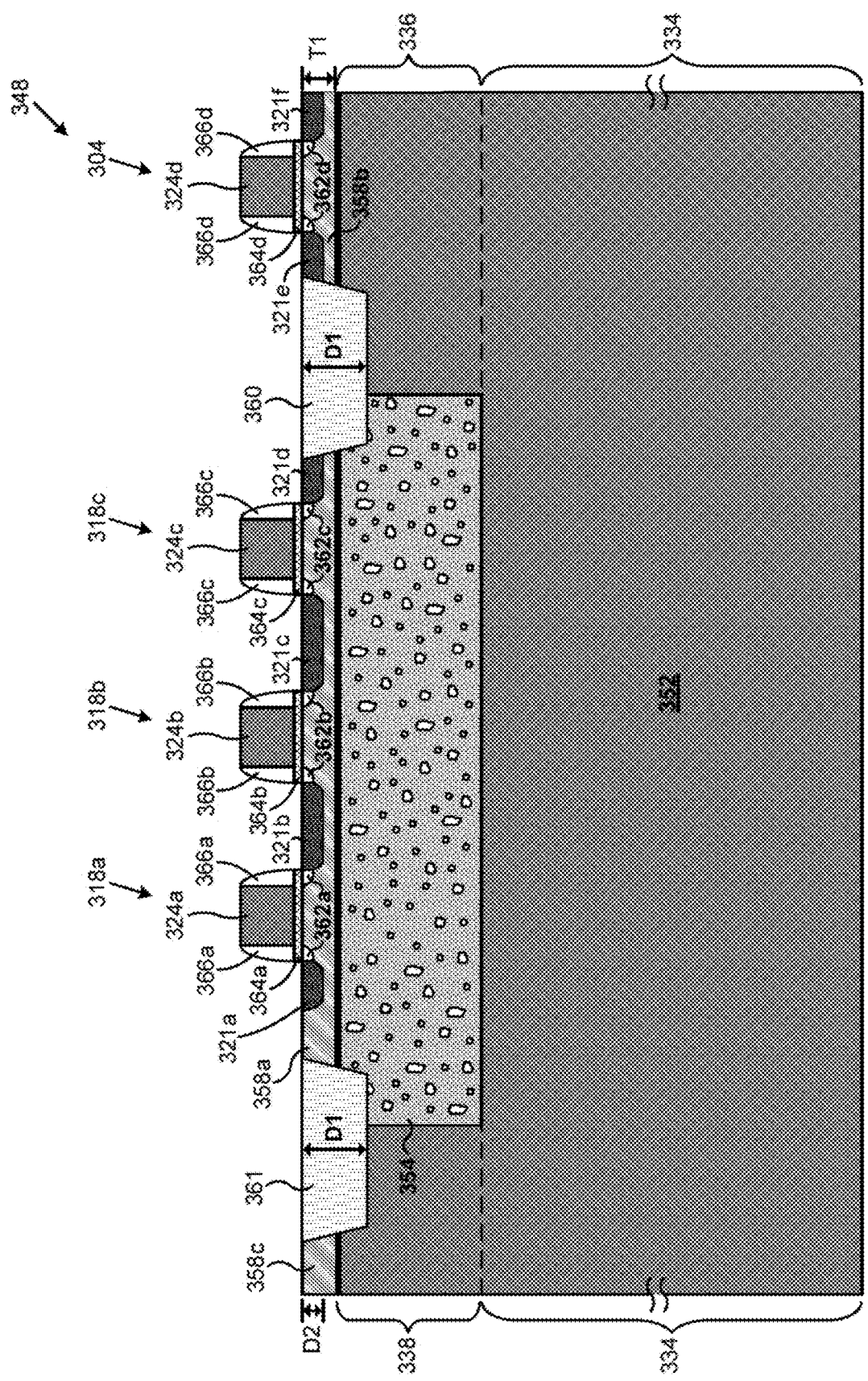
FIG. 3E illustrates a cross-sectional view of a portion of a semiconductor structure processed in accordance with actions 248a and 248b in the flowchart of FIG. 2 according to one implementation of the present application.

FIG. 3E illustrates a cross-sectional view of a portion of a semiconductor structure processed in accordance with actions 248a and 248b in the flowchart of FIG. 2 according to one implementation of the present application. In semiconductor structure 348 of FIG. 3E, transistors 318a, 318b, and 318c are formed in crystalline epitaxial layer 358a. Similarly, transistor 304 is formed in crystalline epitaxial layer 358b. Electrical isolation region 360 separates transistor 304 from transistors 318a, 318b, and 318c.

Transistors 318a, 318b, and 318c in FIG. 3E may generally correspond to transistors 118a, 118b, and 118c (or transistors 126a, 126b, and 126c) utilized in RF switch 112 in FIG. 1. Transistor 318a includes source/drain junctions 321a and 321b, gate 324a, lightly doped regions 362a, gate oxide 364a, and spacers 366a. Transistor 318b includes source/drain junctions 321b and 321c, gate 324b, lightly doped regions 362b, gate oxide 364b, and spacers 366b. Transistor 318c includes source/drain junctions 321c and 321d, gate 324c, lightly doped regions 362c, gate oxide 364c, and spacers 366c. Source/drain junction 321b is shared by semiconductor devices 318a and 318b; source/drain junction 321c is shared by semiconductor devices 318b and 318c.

Transistor 304 in FIG. 3E can be utilized in an amplifier, such as PA 104 (or LNA 108) in FIG. 1. Transistor 304 includes source/drain junctions 321e and 321f, gate 324d, lightly doped regions 362d, gate oxide 364d, and spacers 366d. In one implementation, transistor 304 can be utilized as part of a logic circuit. Transistor 304 is considered optional in that semiconductor structures according to the present application can be formed without transistor 304.

Gates 324a, 324b, 324c, and 324d can comprise, for example, polycrystalline silicon (polySi). Source/drain junctions 321a, 321b, 321c, 321d, 321e, and 321f can be implanted with a dopant of a different type than their corresponding crystalline epitaxial layer 358a or 358b. Lightly doped regions 362a, 362b, 362c, and 362d can be implanted with a dopant of the same type as their adjacent source/drain junction, but having a lower concentration. Gate oxides 364a, 364b, 364c, and 364d can comprise, for example, silicon dioxide ($SiO_2$). Spacers 366a, 366b, 366c, and 366d can comprise, for example, silicon nitride (SiN).

In the present implementation, depth D2 of source/drain junctions 321a, 321b, 321c, 321d, 321e, and 321f is substantially less than thickness T1 of crystalline epitaxial layers 358a, 358b, and 358c, such that source/drain junctions 321a, 321b, 321c, 321d, 321e, and 321f are not in contact with porous silicon segment 354. In one implementation, source/drain junctions 321a, 321b, 321c, and 321d are implanted with an N-type dopant (or a P-type dopant in some implementations) in one action, and source/drain junctions 321e and 321f are implanted with an N-type dopant (or a P-type dopant in some implementations) in another separate action. In one implementation, source/drain junctions 321a, 321b, 321c, 321d, 321e, and 321f are implanted with an N-type dopant (or a P-type dopant in some implementations) concurrently in a single action. In various implementations, silicide can be situated over source/drain junctions 321a, 321b, 321c, 321d, 321e, and 321f and/or gates 324a, 324b, 324c, and 324d. In various implementations, semiconductor structure 348 can include more or fewer transistors in crystalline epitaxial layers 358a, 358b, and 358c. For example, another transistor (not shown) can be situated in crystalline epitaxial layer 358c, separated from transistors 318a, 318b, and 318c by electrical isolation region 361. In various implementations, crystalline epitaxial layers 358a, 358b, 358c can include other types of semiconductor devices instead of or in addition to transistors 318a, 318b, 318c, and 304, such as diodes.

Because semiconductor structure 348 includes porous silicon segment 354, semiconductor structure 348 reduces RF signal leakage from transistors 318a, 318b, and 318c to ground. Further, porous silicon segment 354 reduces RF signal interference between the different devices built in crystalline epitaxial layers 358a, 358b, and 358c. Pores in porous silicon segment 354 decrease its effective dielectric constant and increase its resistivity. In semiconductor structure 348 in FIG. 3E, porous silicon segment 354 has a dielectric constant significantly less than the dielectric constant of bulk silicon substrate 352. For example, bulk silicon substrate 352 may have a dielectric constant of approximately 11.7, and porous silicon segment 354 may have a dielectric constant significantly less than 11.7. In particular, porous silicon segment 354 can have a dielectric constant from approximately 2.0 to approximately 4.0.

In semiconductor structure 348 in FIG. 3E, utilizing porous silicon segment 354, with its low dielectric constant, reduces parasitic capacitance between crystalline epitaxial layer 358a and bulk silicon substrate 352. Accordingly, RF signals are less likely to leak from transistors 318a, 318b, and 318c in crystalline epitaxial layer 358a to bulk silicon substrate 352. For example, in one implementation, transistors 318a, 318b, and 318c are utilized to maintain RF switch 112 (shown in FIG. 1) in an OFF state, and bulk silicon substrate 352 functions as a ground. In their OFF states, transistors 318a, 318b, and 318c create a high resistance path along source/drain junctions 321a, 321b, 321c, and 321d. In this OFF state, the RF signals would have been subject to a significant adverse impact of parasitic capacitances with bulk silicon substrate 352 if porous silicon segment 354 were not utilized. In other words, the RF signals could easily leak from transistors 318a, 318b, and 318c to ground, increasing OFF state parasitic capacitance and negatively impacting the performance of semiconductor structure 348. Where transistors 318a, 318b, and 318c are transistors utilized to maintain RF switch 112 (shown in FIG. 1) in an ON state, RF signal leakage, absent porous silicon segment 354, could also result in a higher insertion loss.

Because semiconductor structure 348 includes porous silicon segment 354 in combination with electrical isolation region 360, semiconductor structure 348 also reduces RF signal interference from transistor 304 to transistors 318a, 318b, 318c, and vice versa. If porous silicon segment 354 and electrical isolation region 360 were not utilized, RF signals from semiconductor device 304 could propagate through crystalline epitaxial layers 358b and 358a and/or bulk silicon substrate 352, and interfere with transistors 318a, 318b, 318c and generate additional undesirable noise in transistors 318a, 318b, 318c. Where transistor 304 is utilized in PA 104 (shown in FIG. 1) in an RF transmit path, these consequences could be amplified. Similarly, porous silicon segment 354 in combination with electrical isolation region 361 reduces RF signal interference from crystalline epitaxial layer 358c to transistors 318a, 318b, 318c, and vice versa. Together, the low dielectric constant of porous silicon segment 354 and electrical insulation of electrical isolation regions 360 and 361 reduce RF signal leakage and interference through crystalline epitaxial layers 358a, 358b, and 358c and/or bulk silicon substrate 352. The RF signal leakage and interference are especially reduced where depth D1 of electrical isolation regions 360 and 361 is equal to or greater than thickness T1 of crystalline epitaxial layers 358a, 358b, and 358c.

Semiconductor structure 348 in FIG. 3E can achieve this reduced RF signal leakage without using costly substrate materials, such as quartz or sapphire, and also without requiring costly and/or specialized fabrication techniques used to create trap-rich silicon-on-insulator (SOI) structures, such as smart cut techniques. As described above, porous silicon segment 354 can have a dielectric constant from approximately 2.0 to approximately 4.0, comparable to a buried oxide (BOX) in an SOI structure having a dielectric constant of approximately 3.7. Porous silicon segment 354 can be situated over region 334 of bulk silicon substrate 352, and included in semiconductor structure 348 by various fabrication techniques. Thereafter, as discussed above, porous silicon segment 354 can be annealed and serve as a high-quality template for growth of crystalline epitaxial layer 358 (shown in FIG. 3C), in which transistors 318a, 318b, 318c, and 304 are formed.

Because semiconductor structure 348 includes regions 336 and 338 of bulk silicon substrate 352 adjacent to porous silicon segment 354, semiconductor structure 348 easily accommodates body contacts for transistors, such as transistor 304. Fewer body contacts can be used in crystalline epitaxial layers 358b and 358c than in crystalline epitaxial layer 358a, since crystalline epitaxial layers 358b and 358c are situated over regions 336 and 338, respectively, of bulk silicon substrate 352 having relatively low resistivity compared to porous silicon segment 354 that underlies crystalline epitaxial layer 358a. Accordingly, semiconductor structure 348 achieves high device density since in areas outside of RF transistor areas (i.e., outside of crystalline epitaxial layer 358a), fewer body contacts are needed.

Further, regions 336 and 338 of bulk silicon substrate 352 adjacent to porous silicon segment 354 increase heat dissipation from crystalline epitaxial layers 358a and 358c. As described above, in semiconductor structure 348 in FIG. 3E, regions 336 and 338 of bulk silicon substrate 352 have a thermal conductivity much greater than a BOX in an SOI structure. For example, bulk silicon substrate 352 may have a thermal conductivity of approximately one hundred fifty watts per meter-kelvin (150 W/(m·K)), whereas the BOX may have a thermal conductivity of approximately one and a half watts per meter-kelvin (1.5 W/(m·K)). Accordingly, high power devices, such transistor 304 utilized in PA 104 (shown in FIG. 1), can be integrated in the same semiconductor structure 348 with transistors 318a, 318b, and 318c without overheating, while also accommodating reduced RF signal leakage. This integration generally reduces losses when connections are ultimately formed between transistor 304 and one of transistors 318a, 318b, and 318c.

Figure 3F:
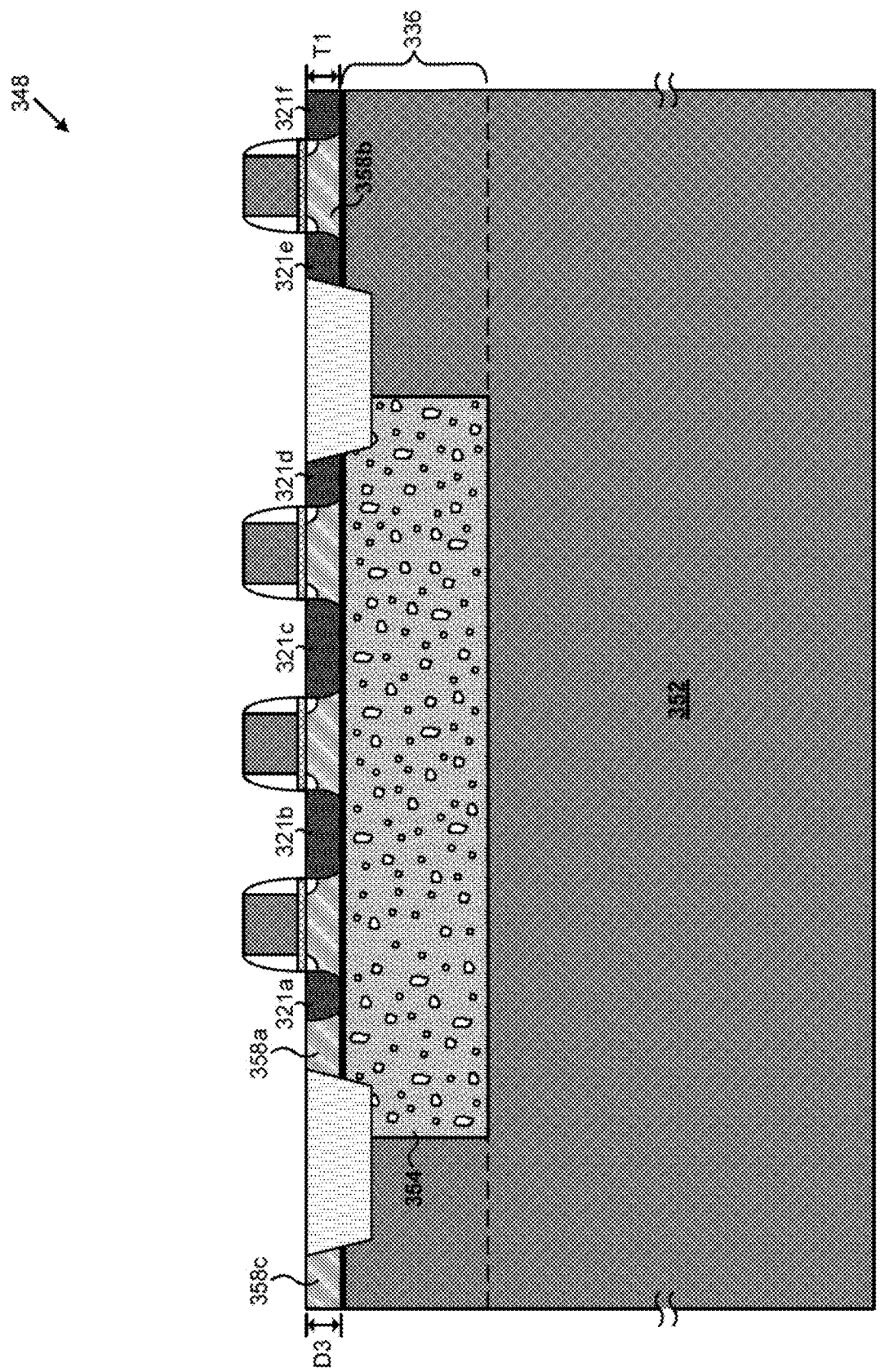
FIG. 3F illustrates a cross-sectional view of a portion of a semiconductor structure processed in accordance with actions 248a and 248b in the flowchart of FIG. 2 according to one implementation of the present application.

FIG. 3F illustrates a cross-sectional view of a portion of a semiconductor structure processed in accordance with actions 248a and 248b in the flowchart of FIG. 2 according to one implementation of the present application. Semiconductor structure 348 of FIG. 3F represents an alternative implementation to semiconductor structure 348 of FIG. 3E. Semiconductor structure 348 of FIG. 3F is similar to semiconductor structure 348 of FIG. 3E, except that, in semiconductor structure 348 of FIG. 3F, depth D3 of source/drain junctions 321a, 321b, 321c, 321d, 321e, and 321f is substantially equal to thickness T1 of crystalline epitaxial layers 358a, 358b, and 358c, such that source/drain junctions 321a, 321b, 321c, and 321d are in contact with porous silicon segment 354, and such that source/drain junctions 321e and 321f are in contact with region 336 of bulk silicon substrate 352. In semiconductor structure 348 of FIG. 3E, shallow source/drain junctions 321a, 321b, 321c, and 321d improve performance of transistors 318a, 318b, and 318c by reducing junction capacitances. In semiconductor structure 348 of FIG. 3F, deeper source/drain junctions 321e and 321f improve performance of transistor 304 by improving high current and high voltage handling. Other than the differences described above, semiconductor structure 348 of FIG. 3F may have any implementations and advantages described above with respect to semiconductor structure 348 of FIG. 3E.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor structure comprising:
   a porous semiconductor segment adjacent to a first region of a substrate;
   at least one crystalline epitaxial layer situated over said porous semiconductor segment and over said first region of said substrate;
   a first semiconductor device situated in said at least one crystalline epitaxial layer over said porous semiconductor segment;
   a second semiconductor device situated in said at least one crystalline epitaxial layer over said first region of said substrate but not over said porous semiconductor segment;
   said first region of said substrate having a first dielectric constant, and said porous semiconductor segment having a second dielectric constant that is substantially less than said first dielectric constant such that said porous semiconductor segment reduces signal leakage from said first semiconductor device.

2. The semiconductor structure of claim 1, wherein a second region of said substrate is situated under said porous semiconductor segment and under said first region of said substrate.

3. The semiconductor structure of claim 1, further comprising:
   an electrical isolation region separating said first and second semiconductor devices.

4. The semiconductor structure of claim 3, wherein a depth of said electrical isolation region is equal to or greater than a thickness of said at least one crystalline epitaxial layer.

5. The semiconductor structure of claim 1, wherein said first semiconductor device is a transistor utilized in a radio frequency (RF) switch.

6. The semiconductor structure of claim 5, wherein a depth of a source/drain junction of said transistor is substantially less than a thickness of said at least one crystalline epitaxial layer, such that said source/drain junction is not in contact with said porous semiconductor segment.

7. The semiconductor structure of claim 5, wherein a depth of a source/drain junction of said transistor is substantially equal to a thickness of said at least one crystalline epitaxial layer, such that said source/drain junction is in contact with said porous semiconductor segment.

8. A semiconductor structure comprising:
- a porous silicon segment adjacent to a first region of a bulk silicon substrate;
- at least one crystalline epitaxial layer situated over said porous silicon segment and over said first region of said bulk silicon substrate;
- a first transistor situated in said at least one crystalline epitaxial layer over said porous silicon segment;
- a second transistor situated in said at least one crystalline epitaxial layer over said first region of said bulk silicon substrate but not over said porous silicon segment;
- an electrical isolation region separating said first and second transistors.

9. The semiconductor structure of claim 8, wherein a second region of said bulk silicon substrate is situated under said porous silicon segment and under said first region of said bulk silicon substrate.

10. The semiconductor structure of claim 8, wherein a depth of said electrical isolation region is equal to or greater than a thickness of said at least one crystalline epitaxial layer.

11. The semiconductor structure of claim 8, wherein said first transistor is utilized in a radio frequency (RF) switch.

12. The semiconductor structure of claim 8, wherein a depth of a source/drain junction of said first transistor is substantially less than a thickness of said at least one crystalline epitaxial layer, such that said source/drain junction is not in contact with said porous silicon segment.

13. The semiconductor structure of claim 8, wherein a depth of a source/drain junction of said first transistor is substantially equal to a thickness of said at least one crystalline epitaxial layer, such that said source/drain junction is in contact with said porous silicon segment.

14. A semiconductor structure comprising:
- a porous silicon segment adjacent to a bulk silicon substrate;
- at least one crystalline epitaxial layer having a first region situated over said porous silicon segment;
- said at least one crystalline epitaxial layer having a second region situated over said bulk silicon substrate but not over said porous silicon segment;
- an electrical isolation region separating said first region of said at least one crystalline epitaxial layer from said second region of said at least one crystalline epitaxial layer.

15. The semiconductor structure of claim 14, wherein a depth of said electrical isolation region is equal to or greater than a thickness of said at least one crystalline epitaxial layer.

16. The semiconductor structure of claim 14, wherein a first semiconductor device is situated in said first region of said at least one crystalline epitaxial layer and a second semiconductor device is situated in said second region of said at least one crystalline epitaxial layer.

17. The semiconductor structure of claim 16, wherein said first semiconductor device is a first transistor and wherein a depth of a source/drain junction of said first transistor is substantially less than a thickness of said at least one crystalline epitaxial layer, such that said source/drain junction is not in contact with said porous silicon segment.

18. The semiconductor structure of claim 16, wherein said first semiconductor device is a first transistor and wherein a depth of a source/drain junction of said first transistor is substantially equal to a thickness of said at least one crystalline epitaxial layer, such that said source/drain junction is in contact with said porous silicon segment.

19. The semiconductor structure of claim 16, wherein said first semiconductor device is a first transistor that is utilized in a radio frequency (RF) switch.

* * * * *